United States Patent
Park et al.

(10) Patent No.: US 8,193,497 B2
(45) Date of Patent: Jun. 5, 2012

(54) NEAR-INFRARED PHOTODETECTORS, IMAGE SENSORS EMPLOYING THE SAME, AND METHODS OF MANUFACTURING THE SAME

(75) Inventors: Yoon-dong Park, Yongin-si (KR); David Andrew Barclay Miller, Stanford, CA (US); Young-gu Jin, Byeongjeom-Hwaseong-si (KR); In-sung Joe, Seoul (KR)

(73) Assignees: Samsung Electronics Co., Ltd., Gyeonggi-do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 231 days.

(21) Appl. No.: 12/656,684

(22) Filed: Feb. 12, 2010

(65) Prior Publication Data

US 2011/0198499 A1 Aug. 18, 2011

(51) Int. Cl.
*H01L 27/148* (2006.01)
(52) U.S. Cl. ............................................. 250/332
(58) Field of Classification Search ........... 250/208.1, 250/332; 257/438, E21.158, E31.063
See application file for complete search history.

(56) References Cited

U.S. PATENT DOCUMENTS

| | | | | |
|---|---|---|---|---|
| 5,432,374 | A  * | 7/1995 | Norton | 257/442 |
| 6,627,914 | B1 * | 9/2003 | Komiyama et al. | 257/29 |
| 7,078,695 | B2 * | 7/2006 | Luukanen | 250/336.2 |
| 2007/0215860 | A1 * | 9/2007 | Komiyama et al. | 257/21 |

FOREIGN PATENT DOCUMENTS

| | | |
|---|---|---|
| JP | 11-004017 | 1/1999 |
| JP | 2007-303927 | 11/2007 |
| JP | 2008-039684 | 2/2008 |
| JP | 2008-241465 | 10/2008 |

* cited by examiner

*Primary Examiner* — David Porta
*Assistant Examiner* — Marcus Taningco
(74) *Attorney, Agent, or Firm* — Harness, Dickey & Pierce, P.L.C.

(57) ABSTRACT

Silicon photodetectors using near-infrared dipole antennas. The photodetectors include a silicon region formed on a semiconductor substrate, dipole antenna forming two arms that are spaced apart with the silicon region therebetween and inducing an electromagnetic wave signal of incident light, and electrodes disposed in a vertical direction of the dipole antenna and spaced apart with the silicon region therebetween, where a critical bias voltage is applied to the electrodes to induce an avalanche gain operation in the silicon region.

15 Claims, 11 Drawing Sheets

NEAR-INFRARED PHOTODETECTORS, IMAGE SENSORS EMPLOYING THE SAME, AND METHODS OF MANUFACTURING THE SAME

BACKGROUND

1. Field

Example embodiments of the inventive concepts relate to optical devices, and more particularly, to near-infrared photodetectors inducing an avalanche phenomenon, image sensors including the near-infrared photodetectors, and semiconductor manufacturing methods thereof.

2. Description of the Related Art

A problem in combining optics and electronics may be that a micrometer-scale of the optics is much bigger than a nanometer-scale of an electronic device. When photons are converted into electrons by a photodetector, size discordance between the photons and the electrons may result in disadvantages with respect to power dissipation, area, latency, and/or noise.

SUMMARY

Example embodiments of the inventive concepts provide nanometer-scale near-infrared photodetectors, methods of manufacturing the photodetectors and image sensors including the photodetectors.

Example embodiments of the inventive concepts may provide photodetectors, the photodetectors including a silicon region formed on a semiconductor substrate, a dipole antenna forming two arms that are spaced apart with the silicon region therebetween and inducing an electromagnetic wave signal of incident light, and electrodes disposed in a vertical direction of the dipole antenna and spaced apart with the silicon region therebetween, where a critical bias voltage is applied to the electrodes to induce an avalanche gain operation in the silicon region.

Example embodiments of the inventive concepts may provide photodetectors, the photodetectors including a substrate, a semiconductor region on the substrate, an antenna including first and second arms on the substrate, the semiconductor region between the arms, and first and second electrodes on the substrate, the semiconductor region between the electrodes, the electrodes configured to induce an avalanche gain in the semiconductor region upon application of a bias voltage.

The photodetectors may convert light of a near-infrared region into an electrical signal. The dipole antenna may include the arms each having a length corresponding to a quarter of the near-infrared wavelength. The dipole antenna may be on a silicon oxide layer on the semiconductor substrate. The semiconductor region may have a nano-scale structure having thicknesses of about 100 nm and about 200 nm in directions of the dipole antenna and the electrodes, respectively. The critical bias voltage may be in the range of about 3 V to about 5 V. The photodetectors may be used in optical communication using an infrared ray that is used to exchange information by using a device-to-device communication device.

Example embodiments of the inventive concepts may provide methods of manufacturing photodetectors, the methods including forming an oxide layer on a semiconductor substrate, forming a silicon film on the oxide layer, patterning the silicon film, depositing a conductive layer on the patterned silicon film, and patterning the conductive layer, forming dipole antenna forming two arms spaced apart with the patterned silicon film therebetween, and forming electrodes disposed in a vertical direction of the dipole antenna, spaced apart with the patterned silicon film therebetween, and formed on a part of the patterned silicon film. The patterned silicon film may be formed to have a small thickness of about 70 nm so as to induce a strong optical field concentration.

Example embodiments of the inventive concepts may provide methods of manufacturing photodetectors, the methods including forming an oxide layer on a substrate, forming a silicon film on the oxide layer, patterning the silicon film, depositing a conductive layer on the patterned silicon film, and patterning the conductive layer to form a dipole antenna and electrodes, the patterned silicon film between arms of the dipole antenna and between the electrodes, the electrodes separated from the antenna and partially overlapping the patterned silicon film.

Example embodiments of the inventive concepts may provide image sensors, the image sensors including a plurality of pixels arranged on a semiconductor substrate, one of the plurality of pixels including a photodetector converting incident light into an electrical signal and a signal transmitting unit outputting the electrical signal as a pixel data signal, where the photodetector includes a silicon region on the semiconductor substrate, a dipole antenna forming two arms that are spaced apart with the silicon region therebetween and inducing an electromagnetic wave signal of incident light, and electrodes disposed in a vertical direction of the dipole antenna and spaced apart with the silicon region therebetween, and a critical bias voltage is applied to the electrodes to induce an avalanche gain operation in the silicon region.

Example embodiments of the inventive concepts may provide image sensors, the image sensors including a plurality of pixels arranged on a semiconductor substrate, one of the plurality of pixels including a photodetector configured to convert incident light into an electrical signal, the photodetector including a silicon region on the substrate, a dipole antenna having two arms on the substrate, the silicon region between the two arms, and electrodes separated from the dipole antenna on the substrate, the silicon region between the electrodes, the electrodes configured to induce avalanche gain in the silicon region upon application of a bias voltage to the electrodes, and a signal transmitting unit configured to output the electrical signal as a pixel data signal.

The photodetector and the signal transmitting unit may be simultaneously manufactured by a metal oxide semiconductor (MOS) manufacturing process. The two antenna arms in the photodetector may have different lengths according to wavelengths of light to be detected. The signal transmitting unit may includes a transfer transistor transmitting optical charges generated in the photodetector to a floating diffusion region, a reset transistor resetting the floating diffusion region to a power source voltage level and discharging charges stored in the floating diffusion region, a drive transistor generating the pixel data signal corresponding to charges accumulated in the floating diffusion region, and a select transistor that receives switching and addressing signals and transmits the pixel data signal to an output terminal.

BRIEF DESCRIPTION OF THE DRAWINGS

Example embodiments of the inventive concepts will be more clearly understood from the following brief description taken in conjunction with the accompanying drawings. FIGS. 1-14 represent non-limiting, example embodiments as described herein.

FIG. 1 is a plan view diagram illustrating a photodetector according to example embodiments of the inventive concepts;

FIGS. 2-4 are cross-sectional views taken along a line A-A' of FIG. 1 illustrating semiconductor manufacturing methods;

FIG. 5 is a cross-sectional view taken along a line II-II' of FIG. 1;

FIGS. 6-8 are images of a photodetector having a structure as illustrated in FIG. 1;

FIG. 9 is a graph of Photo Current (A) as a function of bias Voltage (V) of the photodetector of FIG. 6 for 3 different light powers;

FIG. 11 is a schematic illustrating an apparatus for measuring a response speed of the multi-finger photodetector of FIG. 10A;

FIG. 12 is a graph showing response characteristics according to a measurement result of pump-probe electron optical sampling with respect to the multi-finger photodetector of FIG. 10A;

FIG. 13 is a perspective diagram of a mobile phone including a camera module and an infrared ray module having the photodetector of FIG. 1; and FIG. 14 is a circuit diagram illustrating a unit pixel of an image sensor including the photodetector of FIG. 1.

Figure 1:
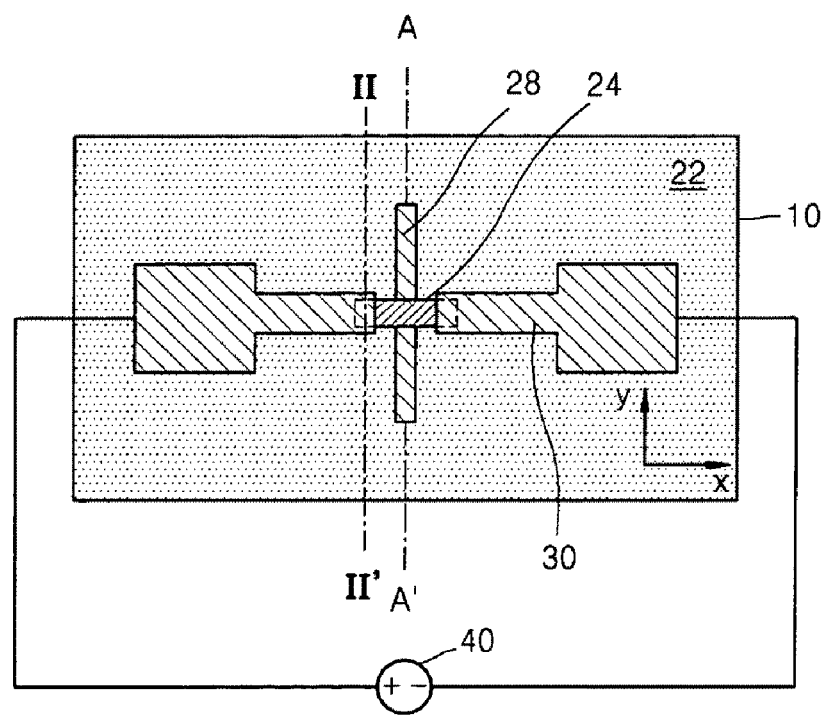

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments of the inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view diagram illustrating a photodetector according to example embodiments of the inventive concepts. FIG. 1 illustrates a top surface of a photodetector 10. The photodetector 10 may convert incident light into an electrical signal. The photodetector 10 may include a dipole antenna 28 oriented in a y-axis direction on a dielectric layer 22 (e.g., a silicon oxide layer). The photodetector 10 may include two electrodes 30 oriented in an x-axis direction. A semiconductor region 24 (e.g., a silicon region) may be partially under a part of the two electrodes 30 and in a gap region between arms of the dipole antenna 28. A power source 40 may apply a bias voltage to the two electrodes 30 and the bias voltage may induce an avalanche gain operation in the semiconductor region 24. A general photodetector implemented as a photodiode may use a p-n junction diode having a large area of about several urn by several um. The photodetector 10 of FIG. 1 may be, for example, a nano-scale silicon photodetector. The semiconductor region 24 may have an area of, for example, about 100 nm×200 nm.

The photodetector 10 may have enhanced characteristics with respect to light of a near-infrared region. The near-infrared region may have a wavelength in the range of from about 750 nm to about 850 nm. The dipole antenna 28 may be a half-wave dipole antenna and may be about 380 nm in length. The half-wave dipole antenna may be a Hertz dipole antenna that may generate electric and magnetic fields at the same time. The dipole antenna 28 may induce an electromagnetic wave of a near-infrared region that is incident to the photodetector 10. The arm of the dipole antenna 28 may be about 160 nm in length.

The length of the dipole antenna 28 may determine main resonance characteristics of the antenna. Due to actual metal characteristics in a near-infrared frequency and a dielectric constant effect of a substrate (e.g., a semiconductor substrate), a resonance antenna may be shorter than a half-wave dipole antenna in a free space. Because the semiconductor region 24 may be formed under parts of the two electrodes 30, a resonance wavelength may be slightly deviated.

The photodetector 10 may use an avalanche gain in which a small number of photogenerated electrons are amplified with a large number of collected electrons. Even if the photodetector 10 has a small structure, a predetermined minimum voltage may be required to induce the avalanche gain. This is because electrons may require energy exceeding a band-gap energy before ion collision of additional electron-hole pairs occurs. Ion collision may be a process in which electron-hole pairs are generated during an avalanche gain process. The successive generation of a plurality of electron-hole pairs may induce the generation of a higher number of electron-hole pairs by the ion collision causing the avalanche gain process. Energy a little greater than a band-gap energy may be applied to electrons in order to begin the ion collision. An applied voltage may be a little larger than an electron-Volt (eV) unit of band-gap energy. 1 eV may be an energy gained when an electron is accelerated by a potential of 1V.

The photodetector 10 may require a bias voltage in the range of from about 3 V to about 5 V as a critical voltage for producing an avalanche gain in a nano-scale structure. This may be a low and/or decreased voltage level relative to, for example, bulk silicon avalanche diodes using a voltage of about 100 V.

Figure 2:
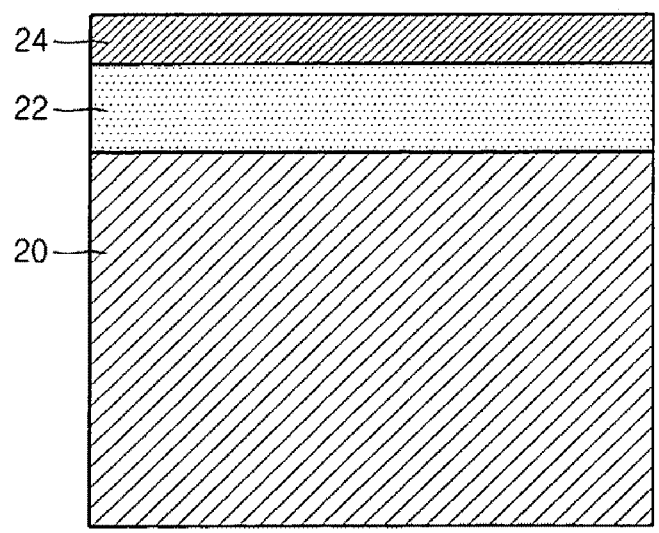
Figure 3:
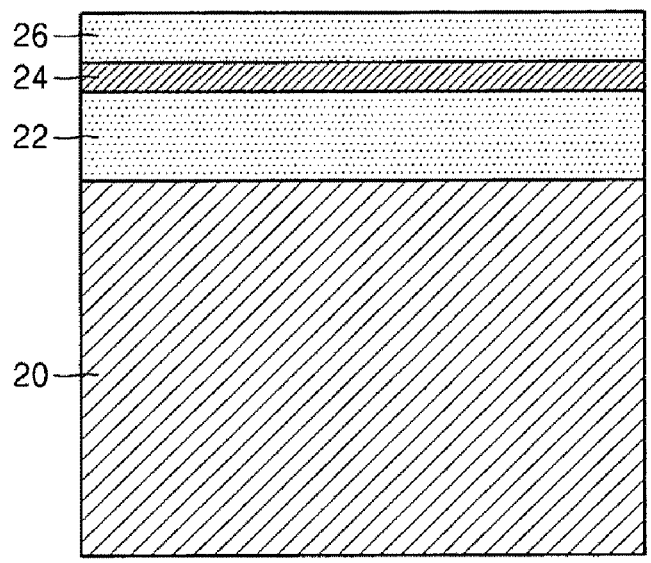
Figure 4:
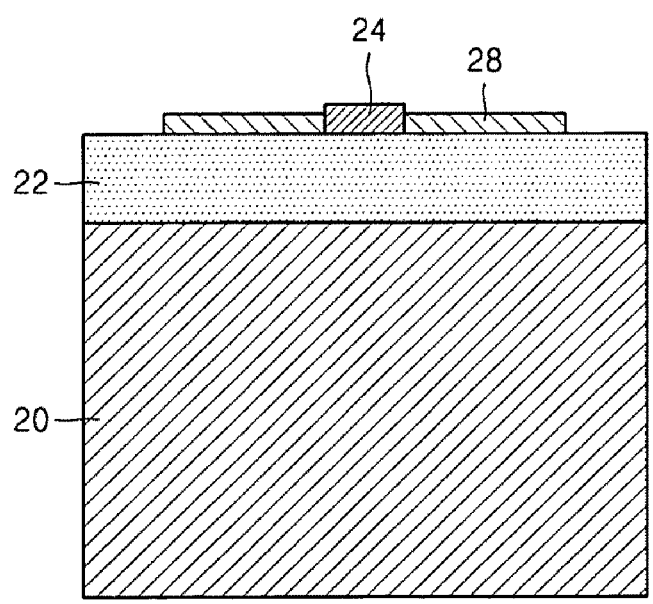

FIGS. 2-4 are cross-sectional views taken along a line A-A' of FIG. 1 illustrating semiconductor manufacturing methods.

Figure 5:
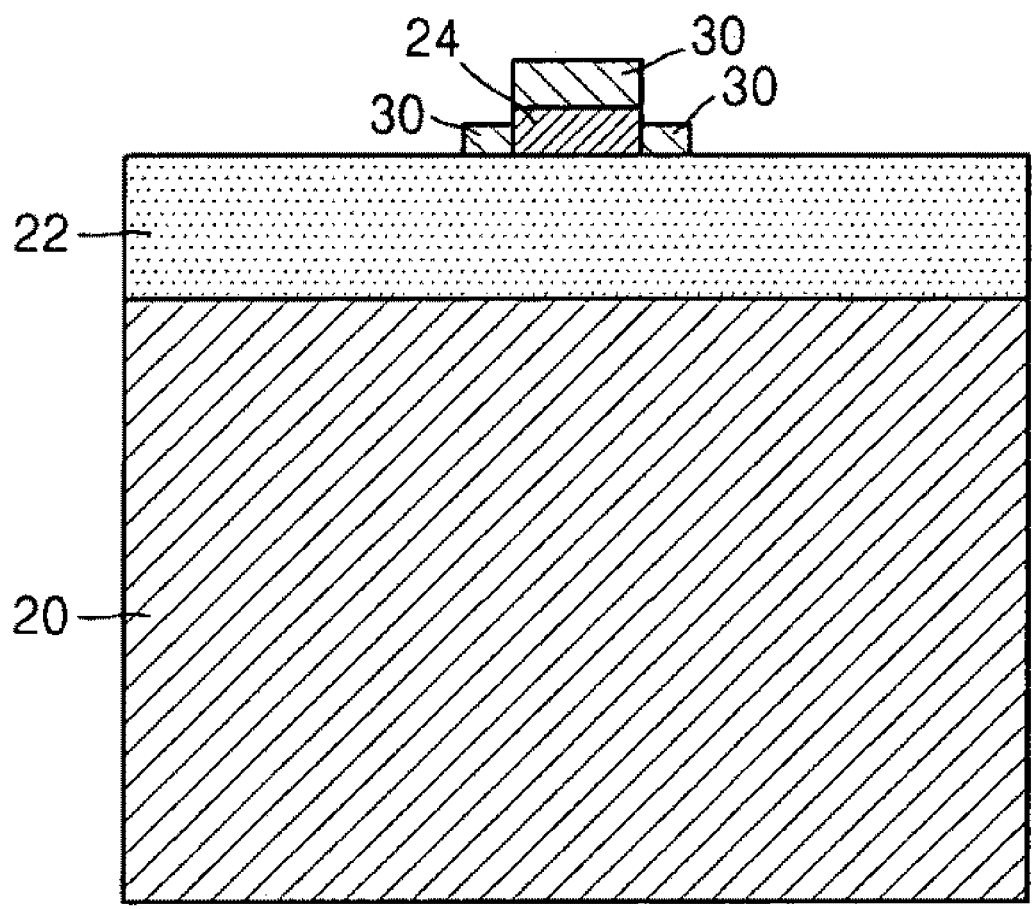

FIG. 5 is a cross-sectional view taken along a line II-II' of FIG. 1. Referring to FIG. 2, a dielectric layer 22 (e.g., SiO2) may be formed on a substrate 20 (e.g., a semiconductor substrate) to form a substrate having, for example, a silicon-on-oxide structure. The dielectric layer 22 may be, for example, about 1 μm thick. The semiconductor film 24 (e.g., a silicon film) may be grown on the dielectric layer 22 to a thickness of, for example, about 340 nm. The semiconductor film 24 may be etched or ground to a thickness of, for example, about 70 nm.

To protect the thin semiconductor film 24, a protective layer 26 (e.g., an oxide layer) may be formed on the semiconductor film 24. The protective layer 26 may be etched and the semiconductor film 24 may patterned as illustrated in FIG. 4. A conductive layer, for example, a metal layer (e.g., Al, Ag, Au, and/or Cr) may be deposited on the patterned semiconductor film 24 and then the conductive layer may be patterned (e.g., by e-beam lithography) to form the dipole antenna 28 and the electrodes 30. The dipole antenna 28 may be formed to have two arms spaced apart with the patterned semiconductor film 24 therebetween. The electrode 30 may be formed on the patterned semiconductor film 24 and the dielectric layer 22 as illustrated in FIG. 5.

The thin semiconductor film 24 that may have a thickness of, for example, about 70 nm according to example embodiments of the inventive concepts may be enhanced so that strong optical field concentrations may occur in a several nanometer-sized metallic structure. A thick silicon structure inducing a photocurrent generated from a greater depth inside the silicon may not be appropriate for measuring a nanometallic-enhanced signal. It may take a long and/or increased time for photocarriers generated from a greater depth inside silicon to collect as photocurrent, thereby deteriorating response characteristics of the photodetector. The dipole antenna 28 may be formed on the dielectric layer 22. The dielectric layer 22 may have a low dielectric constant. If the dipole antenna 28 is directly formed on silicon, for example on the substrate 20, a half-wavelength response may be shortened due to the high dielectric constant of silicon.

Figure 6:
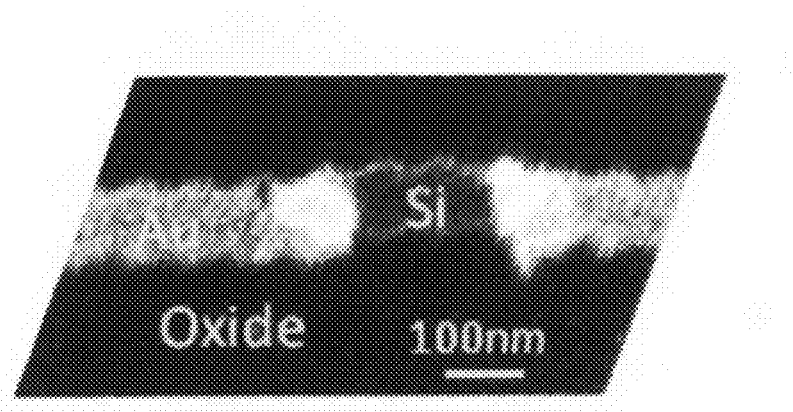
Figure 7:
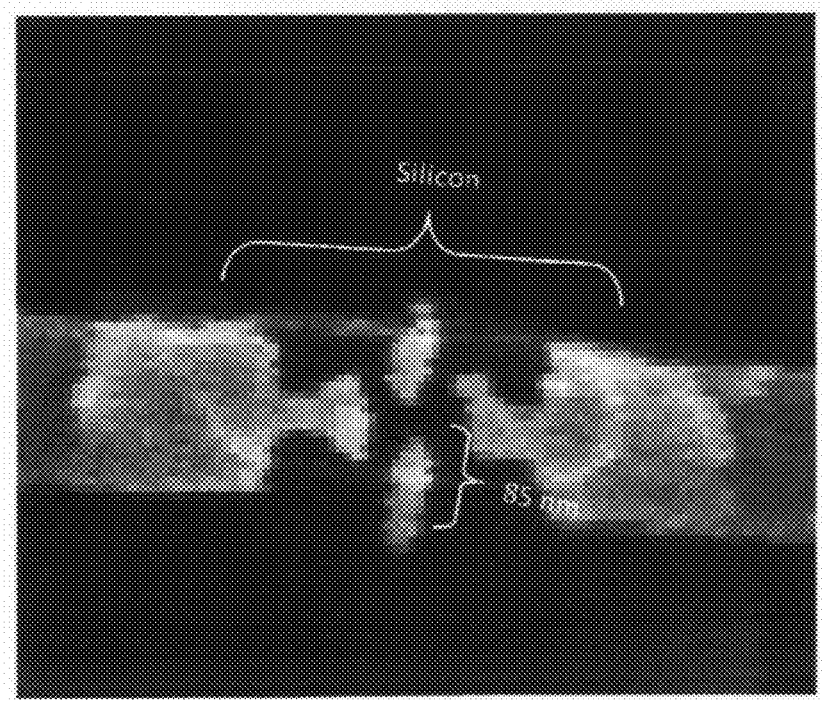
Figure 8:
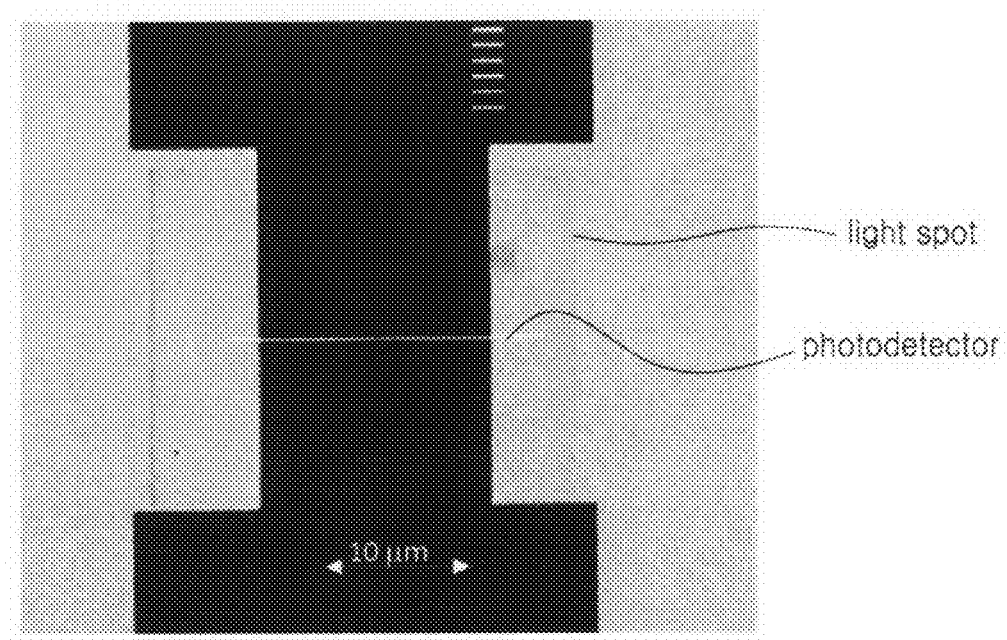

FIGS. 6-8 are images of a photodetector having a structure as illustrated in FIG. 1. FIG. 6 illustrates a photodetector having a silicon nano structure that is connected to ambilateral gold electrodes and formed on the silicon oxide layer. FIG. 7 illustrates two nanometallic antenna arms each having a length of about 85 nm. When near-infrared wavelength light of about 850 nm is shined onto the photodetector of FIG. 6, a spot of the near-infrared wavelength light may be a scale of several microns and larger than the photodetector itself. As illustrated in FIG. 8, the photodetector of FIG. 6 may look like a thin horizontal wire, while the light spot may look like a circular spot.

Figure 9:
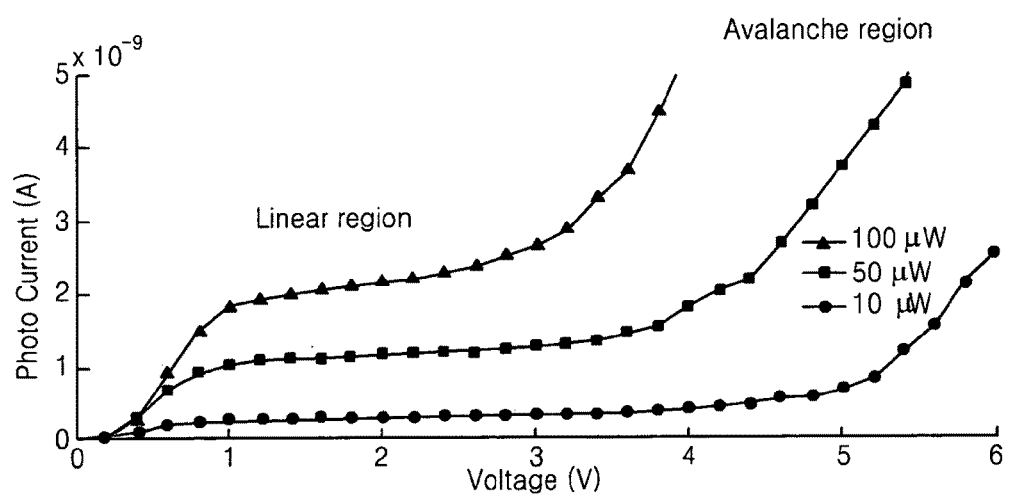

FIG. 9 is a graph of Photo Current (A) as a function of bias Voltage (V) of the photodetector of FIG. 6 for 3 different light powers. When the different light powers have energies of about 10 uW, 50 uW, and 100 uW, respectively, a generated photocurrent may be detected as a bias voltage is gradually increased from 0 V to 6 V as illustrated in FIG. 9. Referring to FIG. 9, in a section of the graph between bias voltages of about 0 V and 1 V, as the light power increases, the detected photocurrent may increase almost linearly. A section of the graph between the bias voltages of about 1 V and 2 V or 3 V may be a linear region where the photocurrent is almost constant. In the linear region, the photodetector may function as a metal-semiconductor-metal structure under an appropriate bias voltage. An almost flat region of the graph between the bias voltages of about 1 V and 2 V or 3 V may correspond to a valid collection of photocarriers, generated by being swept into a depletion region between metal electrodes. After the linear region, an obvious gain is achieved by increasing the bias voltage. As a high and/or increased bias voltage is applied (e.g., greater than about 2-3V), a gradually higher photocurrent may be generated, which may be an avalanche gain.

FIGS. 10A-10D are images of a multi-finger photodetector generating a photocurrent signal for high-speed measurement in order to describe a response speed of the photodetector of FIG. 1. FIGS. 10A-10D may be sequentially enlarged views of the multi-finger photodetector structure formed in the center of an intermediate signal conductive unit of a ground-signal-ground electrical flat strip line. A bias voltage may be applied to left and right sides of the intermediate signal conductive unit of a planar electrical waveguide and a short optical pulse may be radiated onto the photodetector. Photodetecting may induce an oscillating electrical pulse in a planar electrical line. A length of the electrical pulse may be used as a response speed measurement element of the photodetector.

Figure 10A:
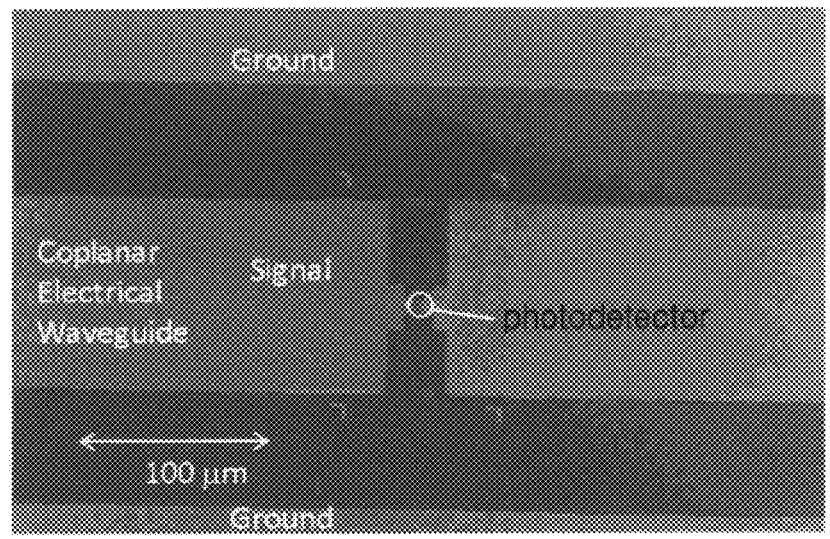
FIGS. 10A-10D are images of a multi-finger photodetector generating a photocurrent signal for high-speed measurement in order to describe a response speed of the photodetector of FIG. 1.
Figure 10B:
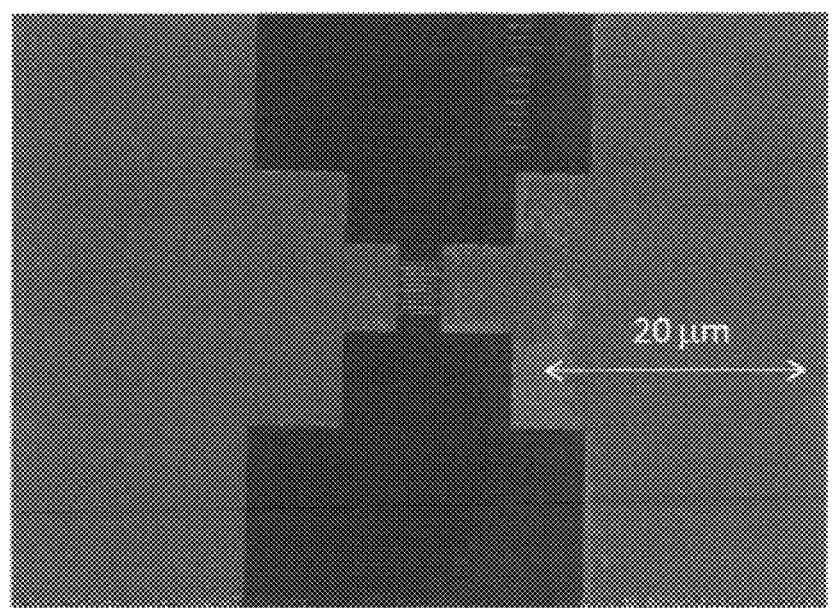
Figure 10C:
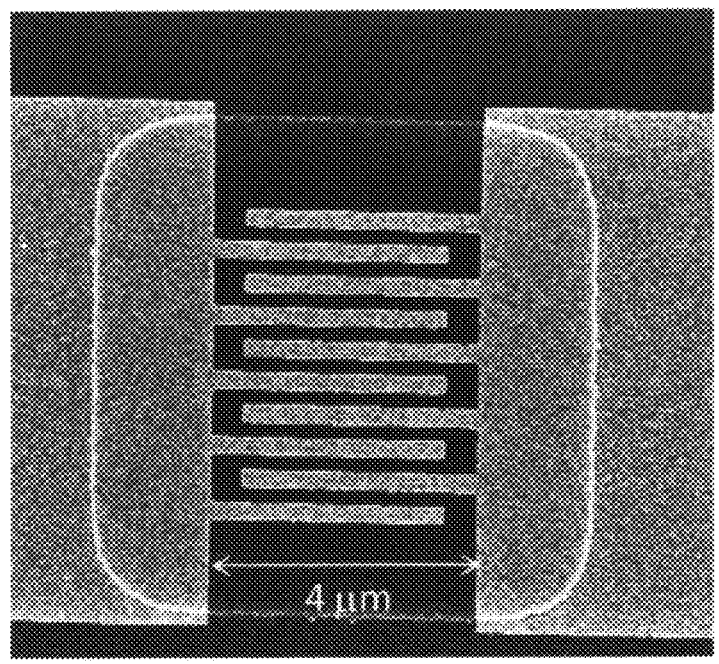
Figure 10D:
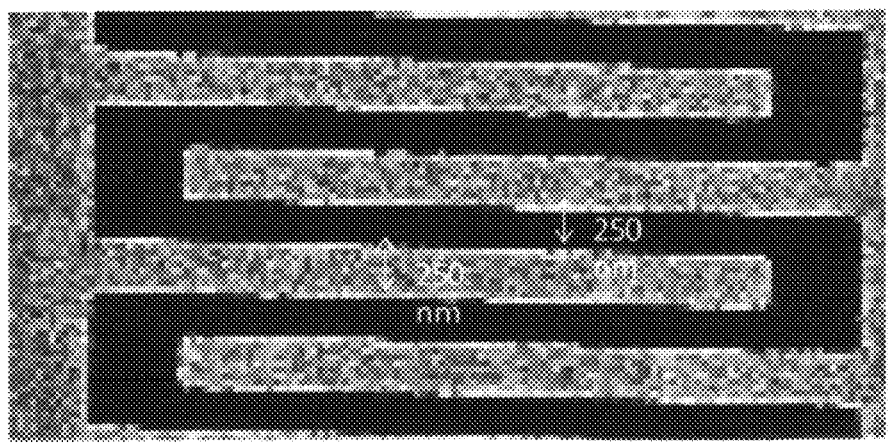
Figure 11:
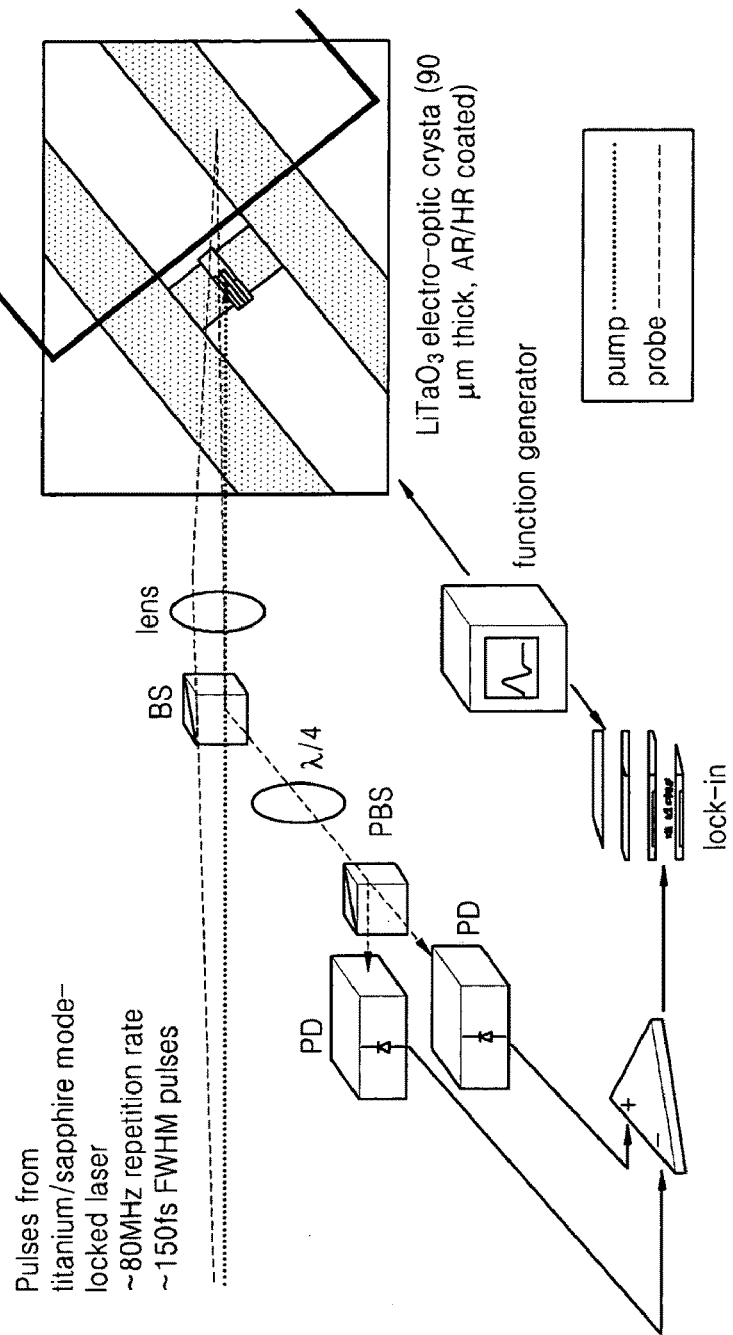

FIG. 11 is a schematic illustrating an apparatus for measuring a response speed of the multi-finger photodetector of FIG. 10A. Referring to FIG. 11, a Ti-sapphire laser may be provided with an optical pulse of 150 fs having a repeating rate of 80 MHz. A pump-pulse beam (shown as a dotted line) may be radiated to the photodetector. A probe-pulse beam (shown as a dashed line) may be sufficiently delayed so as to be controlled and radiated onto a $LiTaO_2$ electron-optical crystal formed on a transmission line on the right side of the photodetector. When a voltage of the right transmission line is changed, polarities of pulses reflected from the $LiTaO_2$ electron-optical crystal may be changed. The polarities may pass through a polarizing beam splitter (PBS) and may be measured using two photodetectors (PDs). By changing a relative delay between the two sets of pulses (e.g., between the pump-pulse and the probe-pulse) the two sets of pulses may be arranged as an electrical pulse on the basis of the measurement result of the two photodetectors.

Figure 12:
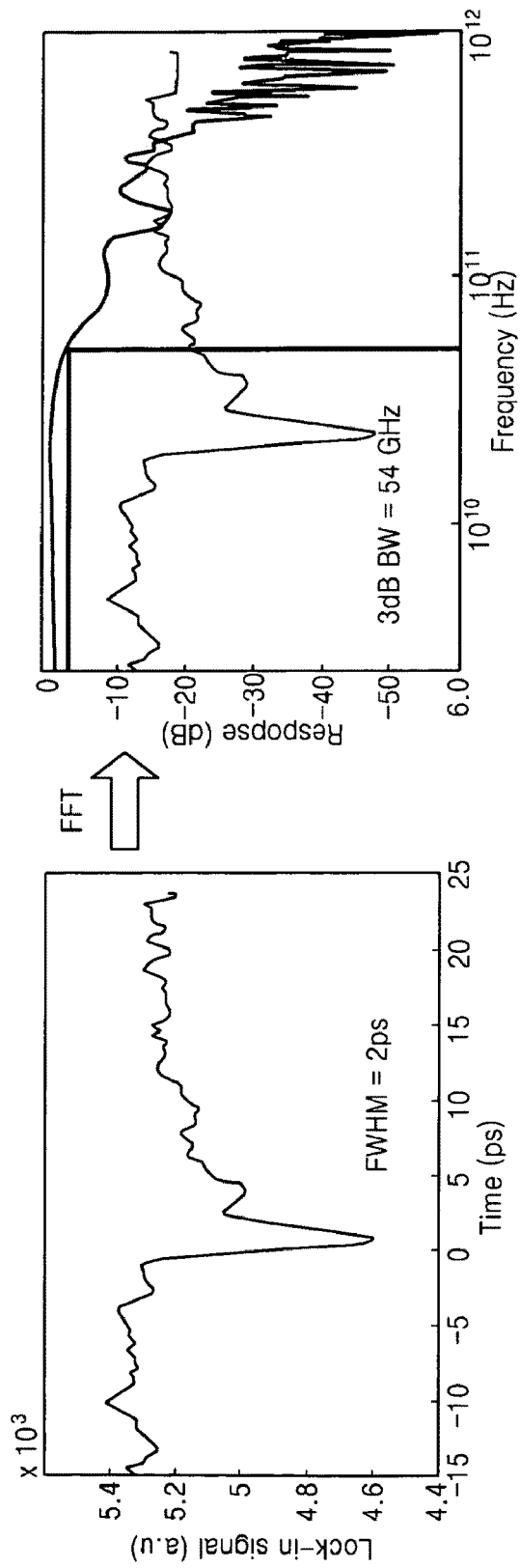

FIG. 12 is a graph showing response characteristics according to a measurement result of pump-probe electron optical sampling with respect to the multi-finger photodetector of FIG. 10A. Referring to FIG. 12, the multi-finger photodetector of FIG. 10A may have a response time of about 2 ps and a measured bandwidth of about 54 GHz. These time scales are congruous with a photodetector that is limited by a speed in which electrons and holes pass through a distance of 250 nm between electrodes. When a semiconductor drift may be 1 micron, a speed of the semiconductor may be limited by a saturated drift velocity of about 10 ps. When the semiconductor drift may be 200 nm, the speed of the semiconductor may be 2 ps, and the speed of the semiconductor may be congruous with the measurement time of the multi-finger photodetector. A nano-scale silicon photodetector may have high-speed and/or improved response characteristics.

Figure 13:
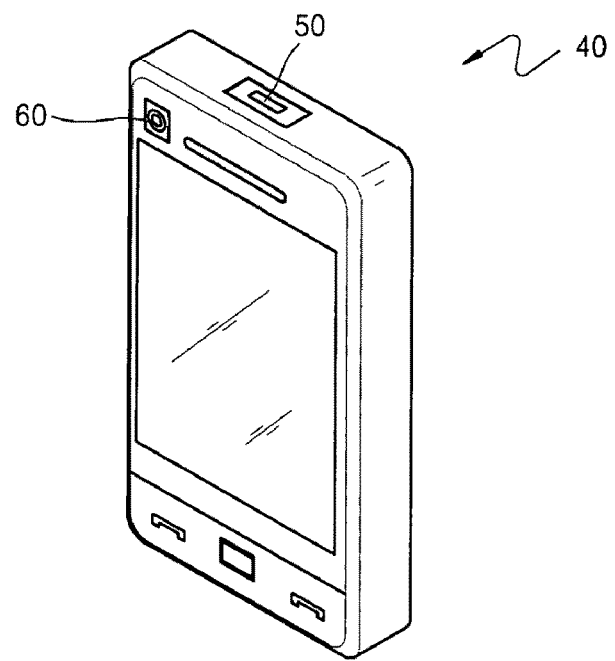

FIG. 13 is a perspective diagram of a mobile phone including a camera module and an infrared ray module having the photodetector of FIG. 1. The photodetector 10 of FIG. 1 may be used in an optical wireless communication method, for example, infrared data association (IrDA) that exchanges information by using a device-to-device communication device. The photodetector 10 may have enhanced characteristics with respect to a near-infrared region and thus may be used in the photodetector 10 when implementing infrared communication. The infrared communication may have a high and/or improved communication speed and may have decreased and/or no cross-talk relative to radio waves. The infrared communication may go straight in only one direction and may, for example, send payment information to a place where a user intends. Infrared communication may have a communication range of 1 m and may be performed only within a user's vision, thereby enabling, for example, safe and/or improved financial transactions to be carried out. The infrared communication may be secure from radio wave interference or noise and may be freely used in, for example, hospitals, gas stations, and/or airplanes. Referring to FIG. 13, an infrared ray module 50 including the photodetector 10 may be installed in a mobile phone 40, which is a light and compact portable communication device. The infrared ray module 50 may also be used in optical communication using general optical fibers. The infrared ray module 50 may operate at a high-speed and/or improved speed and may be appropriate for high-speed optical communication.

The photodetector 10 may be used in an image sensor for converting an optical image into an electrical signal. The image sensor may be used in image systems that may be used in portable terminal apparatuses (e.g., digital cameras, camcorders, personal digital assistants (PDA), mobile phones, etc.). The image sensor may include a charge-coupled device (CCD) image sensor and a complementary metal oxide semiconductor (CMOS) image sensor (CIS). The CCD image sensor may use a high voltage of more than about 10 V and it may be difficult to employ a nano CMOS circuit. It may be difficult to implement a highly integrated CCD image sensor. A manufacturing process of the CCD image sensor may not be compatible with a general CMOS manufacturing process. An image sensor module may be manufactured with at least three chips instead of with a single chip, thereby increasing its volume. Because the CCD image sensor uses a high and/or increased voltage, power consumption may be increased more than 10 times compared to the CIS and the CCD image sensor may not be appropriate for a portable information terminal.

A CIS may implement photodiodes and transistors inside each image pixel similarly to a general CMOS process. Compared to the CCD image sensor including an image signal processing unit in a separate chip, the CIS may integrate a circuit for processing and detecting an image signal in an outer block of a pixel, operate at a low voltage, and/or may be cheap to manufacture. The CIS may include a plurality of pixels arranged on a semiconductor substrate, and may be classified as a 4-transistor pixel structure and/or a 3-transistor pixel structure according to the number of transistors constituting one pixel. Regardless of advantages of the 3-transistor pixel structure in terms of fill factor and manufacturing costs, by separating a light receiving unit and a detecting unit from each other and forming the light receiving unit from bulk silicon, the 4-transistor pixel structure, which may have high and/or improved responsiveness and sensitivity to light, and may be resistant to dark current and noise, may be generally used.

Figure 14:
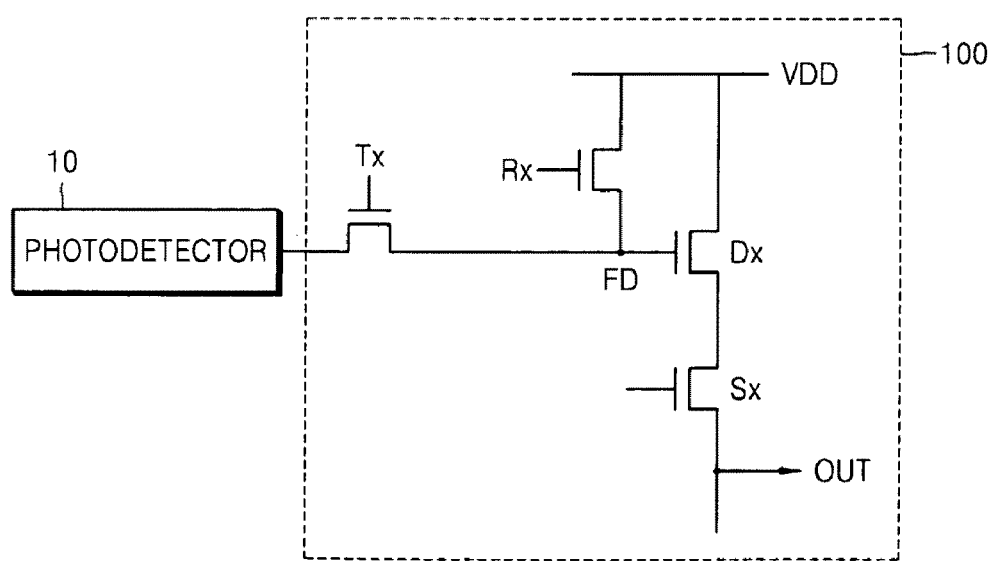

FIG. 14 is a circuit diagram illustrating a unit pixel of a CIS including the photodetector 10 of FIG. 1. The unit pixel may include the photodetector 10 and a CMOS signal transmitting unit 100. An electrical signal generated in the photodetector 10 may be transmitted to an output terminal OUT through the CMOS signal transmitting unit 100. The CMOS signal transmitting unit 100 may include four NMOS transistors and may be formed on a semiconductor substrate through a CMOS manufacturing process. A transfer transistor $T_X$ may transmit charges generated in the photodetector 10 to a floating diffusion node FD. A reset transistor $R_X$ may reset the floating diffusion node FD to a voltage $V_{DD}$ level and discharge the charge stored in the floating diffusion node FD. A drive transistor $D_X$ may generate a pixel data signal corresponding to the charge accumulated in the floating diffusion node FD. A select transistor $S_X$ may receive switching and addressing signals, and may transmit the pixel data signal to the output terminal OUT.

The nano-scale photodetector 10 and the CMOS signal transmitting unit 100 may be simultaneously manufactured to a minimum and/or reduced size through a semiconductor MOS manufacturing process. The unit pixel of the CIS of FIG. 14 may be manufactured to a nano-scale minimum and/or reduced size. A general image sensor may use a color filter array CFA with, for example, R (red), G (green), and B (blue) filters, for color implementation. According to example embodiments of the inventive concepts, the antenna arms formed in the photodetector 10 of FIG. 1 may be formed to have different lengths according to wavelengths of light to be detected. For example, the antenna arms may be about 780/4=195 nm in length in order to detect an R color of about 780 nm, about 600/4=150 nm in length in order to detect a G color of about 600 nm and about 400/4=100 nm in length in order to detect a B color of about 400 nm.

A camera module 60 employing a CIS including the photodetector 10 of FIG. 1 may be installed in the mobile phone 40, as illustrated in FIG. 13. The CIS camera module may include a CIS chip generating a color image signal by using the photodetector 10, and an image signal processor (ISP) chip or a digital signal processor (DSP) that processes the color image signal and transmits the color image signal to a display unit.

While example embodiments have been particularly shown and described, it will be understood by one of ordinary skill in the art that variations in form and detail may be made therein without departing from the spirit and scope of the claims.

What is claimed is:

1. A photodetector, comprising:
    a substrate;
    a semiconductor region on the substrate;
    an antenna including first and second arms on the substrate, the semiconductor region between the arms; and
    first and second electrodes on the substrate, the semiconductor region between the electrodes, the electrodes configured to induce an avalanche gain in the semiconductor region upon application of a bias voltage.

2. The photodetector of claim 1, wherein the photodetector is configured to convert near-infrared light into an electrical signal.

3. The photodetector of claim 2, wherein the antenna is a dipole antenna, and
    the first and second arms each have a length corresponding to a quarter of a near-infrared wavelength.

4. The photodetector of claim 1, further comprising:
    a silicon oxide layer on the substrate, the antenna on the silicon oxide layer.

5. The photodetector of claim 1, wherein a surface area of the semiconductor region is about 100 nm in a direction of the antenna by about 200 nm in a direction of the electrodes.

6. The photodetector of claim 1, wherein the bias voltage is in a range of about 3 V to about 5 V.

7. A device-to-device communication device comprising:
    the photodetector of claim 1,
    wherein the photodetector is configured for infrared optical communication.

8. An image sensor including a plurality of pixels arranged on a semiconductor substrate, one of the plurality of pixels comprising:
    a photodetector configured to convert incident light into an electrical signal, the photodetector including,
        a silicon region on the substrate,
        a dipole antenna having two arms on the substrate, the silicon region between the two arms, and
        electrodes separated from the dipole antenna on the substrate, the silicon region between the electrodes, the electrodes configured to induce avalanche gain in the silicon region upon application of a bias voltage to the electrodes; and
    a signal transmitting unit configured to output the electrical signal as a pixel data signal.

9. The image sensor of claim 8, wherein the photodetector and the signal transmitting unit are simultaneously manufactured by a metal oxide semiconductor (MOS) manufacturing process.

10. The image sensor of claim 8, wherein the two arms of the dipole antenna have lengths according to a wavelength of light to be detected, and
    the photodetector in the one of the plurality of pixels has arm lengths different from a photodetector in a different one of the plurality of pixels.

11. The image sensor of claim 10, wherein the two arms of the dipole antenna each have a length corresponding to a quarter of the wavelength of light to be detected.

12. The image sensor of claim 8, wherein the photodetector further includes a silicon oxide layer on the substrate, the dipole antenna on the silicon oxide layer.

13. The image sensor of claim 8, wherein a surface area of the silicon region is about 100 nm in a direction of the dipole antenna by about 200 nm in a direction of the electrodes.

14. The image sensor of claim 8, wherein the bias voltage is in a range of about 3 V to about 5 V.

15. The image sensor of claim 8, wherein the signal transmitting unit includes a transfer transistor configured to transmit optical charges generated in the photodetector to a floating diffusion region;
    a reset transistor configured to reset the floating diffusion region to a power source voltage level and to discharge charges stored in the floating diffusion region;
    a drive transistor configured to generate the pixel data signal corresponding to charges accumulated in the floating diffusion region; and
    a select transistor configured to receive switching and addressing signals and transmit the pixel data signal to an output terminal.

* * * * *